(12) United States Patent
Steudel et al.

(10) Patent No.: US 8,614,011 B2
(45) Date of Patent: Dec. 24, 2013

(54) ELECTROLUMINESCENT MATERIALS AND OPTICAL DEVICE

(75) Inventors: Annette Steudel, Cambridge (GB); Thomas Pounds, Cambridge (GB)

(73) Assignees: Cambridge Display Technology Limited, Cambridgeshire (GB); Sumitomo Chemical Co., Ltd., Tokyo (JP)

( * ) Notice: Subject to any disclaimer, the term of this patent is extended or adjusted under 35 U.S.C. 154(b) by 98 days.

(21) Appl. No.: 13/055,756

(22) PCT Filed: Jul. 23, 2009

(86) PCT No.: PCT/GB2009/001832
§ 371 (c)(1),
(2), (4) Date: Apr. 8, 2011

(87) PCT Pub. No.: WO2010/010356
PCT Pub. Date: Jan. 28, 2010

(65) Prior Publication Data
US 2011/0186826 A1    Aug. 4, 2011

(30) Foreign Application Priority Data

Jul. 25, 2008 (GB) .................... 0813656.6

(51) Int. Cl.
*H01L 51/54* (2006.01)
(52) U.S. Cl.
USPC ........... 428/690; 428/917; 313/504; 313/505; 313/506; 257/E51.05; 257/E51.026; 544/234; 546/79; 546/81; 546/110; 548/418; 548/440
(58) Field of Classification Search
USPC .................. 428/690, 917; 313/504, 505, 506; 257/E51.05, E51.026; 544/234; 546/79, 81, 101; 564/26, 426; 548/418, 548/440
See application file for complete search history.

(56) References Cited

U.S. PATENT DOCUMENTS

| 4,618,453 | A | 10/1986 | Kim |
| 5,150,006 | A | 9/1992 | Van Slyke et al. |

(Continued)

FOREIGN PATENT DOCUMENTS

| DE | 2 154 660 A1 | 5/1972 |
| EP | 0 707 020 A2 | 4/1996 |

(Continued)

OTHER PUBLICATIONS

Alekseeva et al., "Synthesis and Spectral Properties of benzo[b]phenoxazine Derivatives," Khimiya Geterotsiklicheskikh Soedinenii, 1:125-129 (1995). Abstract Only.

(Continued)

*Primary Examiner* — Gregory Clark
(74) *Attorney, Agent, or Firm* — Marshall, Gerstein & Borun LLP

(57) ABSTRACT

An electroluminescent material comprises the following structural unit:

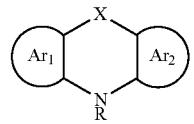

where X is selected from a group consisting of NR, O, S, SO, $SO_2$, $CR_2$, PR, POR, BR, $SiR_2$; where R is a substituent group and $Ar^1$ and $Ar^2$ comprise aromatic rings; and, wherein $Ar^1$ or $Ar^2$ is fused to a further aryl system $Ar^3$. An optical device comprises a first electrode for injection of positive charge carriers, a second electrode for injection of negative charge carriers and a layer located between the first and second electrode comprising the electroluminescent material.

24 Claims, 1 Drawing Sheet

(56) References Cited

U.S. PATENT DOCUMENTS

| | | | |
|---|---|---|---|
| 5,432,014 | A | 7/1995 | Sano et al. |
| 5,518,825 | A | 5/1996 | Murayama et al. |
| 5,621,131 | A | 4/1997 | Kreuder et al. |
| 5,723,873 | A | 3/1998 | Yang |
| 5,798,170 | A | 8/1998 | Zhang et al. |
| 6,083,634 | A | 7/2000 | Shi |
| 6,126,867 | A | 10/2000 | Kanitz et al. |
| 6,174,961 | B1 | 1/2001 | Kanitz et al. |
| 6,268,695 | B1 | 7/2001 | Affinito |
| 6,353,059 | B2 | 3/2002 | Kanitz et al. |
| 6,353,083 | B1 | 3/2002 | Inbasekaran et al. |
| 6,902,832 | B2 | 6/2005 | Uchida et al. |
| 6,953,628 | B2 | 10/2005 | Kamatani et al. |
| 7,030,138 | B2 | 4/2006 | Fujimoto et al. |
| 7,125,998 | B2 | 10/2006 | Stossel et al. |
| 7,238,435 | B2 | 7/2007 | Kamatani et al. |
| 7,527,879 | B2 | 5/2009 | Kamatani et al. |
| 2001/0053818 | A1 | 12/2001 | Kanitz et al. |
| 2002/0117662 | A1 | 8/2002 | Nii |
| 2002/0182441 | A1 | 12/2002 | Lamansky et al. |
| 2003/0099865 | A1 | 5/2003 | Uchida et al. |
| 2004/0127666 | A1 | 7/2004 | Inbasekaran et al. |
| 2005/0164034 | A1 | 7/2005 | Park et al. |
| 2006/0166037 | A1 | 7/2006 | Son et al. |
| 2007/0238857 | A1* | 10/2007 | Wu et al. .................. 528/422 |
| 2008/0088228 | A1* | 4/2008 | Noguchi et al. ............ 313/504 |

FOREIGN PATENT DOCUMENTS

| | | |
|---|---|---|
| EP | 0 842 208 | 5/1998 |
| EP | 0 880 303 A1 | 11/1998 |
| EP | 0 901 176 A2 | 3/1999 |
| EP | 0 947 123 A1 | 10/1999 |
| EP | 0 949 850 A1 | 10/1999 |
| EP | 1 245 659 A1 | 10/2002 |
| GB | 2 348 316 A | 9/2000 |
| JP | 06-017047 A | 1/1994 |
| JP | 07-090254 A | 4/1995 |
| JP | H11-024294 A | 1/1999 |
| JP | H11-311816 A | 11/1999 |
| JP | 2000-081645 A | 3/2000 |
| JP | 2000-286055 A | 10/2000 |
| JP | 2001-081453 A | 3/2001 |
| JP | 2002-324679 A | 11/2002 |
| JP | 2006-233187 A | 9/2006 |
| JP | 2007-070620 A | 3/2007 |
| WO | WO-94/29314 A1 | 12/1994 |
| WO | WO-98/10621 A1 | 3/1998 |
| WO | WO-98/57381 A1 | 12/1998 |
| WO | WO-99/48160 A1 | 9/1999 |
| WO | WO-00/48258 A1 | 8/2000 |
| WO | WO-00/53656 A1 | 9/2000 |
| WO | WO-00/55927 A1 | 9/2000 |
| WO | WO-01/19142 A1 | 3/2001 |
| WO | WO-01/62869 | 8/2001 |
| WO | WO-01/81649 A1 | 11/2001 |
| WO | WO-02/05599 A1 | 1/2002 |
| WO | WO-02/31896 A2 | 4/2002 |
| WO | WO-02/44189 A1 | 6/2002 |
| WO | WO-02/45466 A1 | 6/2002 |
| WO | WO-02/066552 A1 | 8/2002 |
| WO | WO-02/068435 A1 | 9/2002 |
| WO | WO-02/081448 A1 | 10/2002 |
| WO | WO-02/084759 A1 | 10/2002 |
| WO | WO-03/018653 A1 | 3/2003 |
| WO | WO-03/022908 A1 | 3/2003 |
| WO | WO-2008/01608 A1 | 2/2008 |

OTHER PUBLICATIONS

Bernius et al., "Progress with Light-Emitting Polymers", *Adv. Mater.*, 12(23):1737-1750 (2000).

Chen et al., "Recent Developments in Molecular Organic Electroluminescent Materials," *Macromol. Sym.*, 125:1-48 (1997).

Chen et al., "Triplet exciton confinement in phosphorescent polymer light-emitting diodes," *Applied Physics Letters*, 82(7):1006-1008 (2003).

Cleave et al., "Harvesting Singlet and Triplet Energy in Polymer LEDs," *Adv. Matter*, 11(4):285-288 (1999).

Giroux, "Synthesis of Benzylic Boronates via Palladium-Catalyzed Cross-Coupling Reaction of bis(pinacolato)diboron with Benzylic Halides," *Tetrahedron Lett.*, 44(2):233-235 (2003).

Ikai et al., "Highly efficient phosphorescence from organic light-emitting devices with an exciton-block layer," *Applied Physics Letters*, 79(2):156-158 (2001).

Ishiyama et al., "Palladium(0)—Catalyzed Cross-Coupling Reaction of Alkoxydiboron with Haloarenes: A Direct Procedure for Arylboronic Esters," *J. Org. Chem.*, 60(23):7508-7510 (1995).

Lane et al., "Origin of Electrophosphorescence from a Doped Polymer Light Emitting Diode," *Phys. Rev. B*, 63:235206-1-235206-8 (2001).

Lasovsky et al., "Jednoduché Metody Kvantové Chemie a Jejich Aplikace na Latky Fenoxazinového Typu," *Acta Universitatis Palackianae Olomucensis*, 11(1):367-373 (1974).

Lasovsky et al., "Reaktivita a Orientacni vliv Heteroatomu u Latek Fenoxazinového Typu," *Acta Universitatis Palackianae Olomucensis*,11(1):375-380 (1971).

Lee et al., "Polymer phosphorescent light-emitting devices doped with tris(2-phenylpyridine) iridium as a triplet emitter," *Applied Physics Letters*, 77(15):2280-2282 (2000).

Li et al., "Organic Light-Emitting Materials and Devices," Taylor & Francis (2007). Table of Contents only.

Niu et al., "Thermal annealing below the glass transition temperature: A general way to increase performance of light-emitting diodes based on copolyfluorenes", *Applied Physics Letters*, 81(4):634-636 (2002).

O'Brien et al., "Electrophosphorescence from a doped polymer light emitting diode," *Synthetic Metals*, 116:379-383 (2001).

Okamoto et al., "1,4-Benzoxazino[2,3-$b$]phenoxazine and Its Sulfur Analogues: Synthesis, Properties, and Application to Organic Light-Emitting Diodes," *Chem. Mater.*, 17:5504-5511 (2005).

Scherf et al., "Tuning the Chromophoric Properties of Conjugated Polymers-Synthesis and Processing," *Polymer Preprints*, 35(1):200-201 (1994).

Schindler et al., "Single and Double Suzuki-Miyaura Couplings with Symmetric Dihalobenzenes," *Angew. Chem. Int. Ed.*, 44:1520-1525 (2005).

Setayesh et al., "Bridging the Gap between Polyfluorene and Ladder-Poly-$p$-phenylene: Synthesis and Characterization of Poly-2,8-indenofluorene", *Macromolecules*, 33:2016-2020 (2000).

Sinclair et al., "Single and Double Suzuki-Miyaura Couplings with Symmetric Dihalobenzenes," *J. Org. Chem.*, 70(9):3730-3733 (2005).

Yamaguchi et al., "Effects of B and C on the Ordering of L10-CoPt Thin Films," *Appl. Phys. Lett.*, 79(13):2001-2003 (2001).

Yamamoto, "Electrically Conducting and Thermally Stable π-Conjugated Poly(Arylene)s Prepared by Organometallic Processes," *Prog. Polym. Sci.*, 17:1153-1205 (1993).

Yang et al., "Efficient blue polymer light-emitting diodes from a series of soluble poly(paraphenylene)s", *J. Appl. Phys.*, 79(2):934-939 (1996).

Zhu et al., "Synthesis of new iridium complexes and their electrophosphorescent properties in polymer light-emitting diodes," *J. Mater. Chem.*, 13:50-55 (2003).

International Preliminary Report on Patentability for Application No. PCT/GB2009/001832, dated Jan. 25, 2011.

International Search Report and Written Opinion for Application No. PCT/GB2009/001832, dated Mar. 8, 2010.

Search Report for Application No. GB0813656.6, dated Nov. 24, 2008.

\* cited by examiner

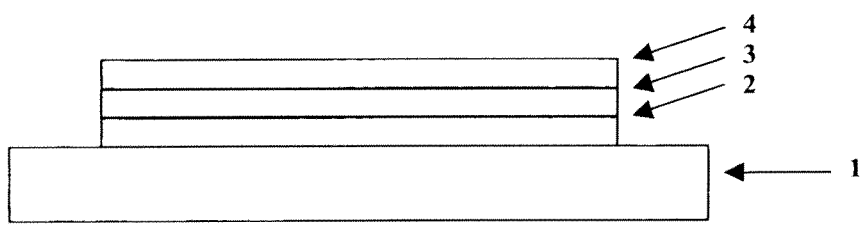

ELECTROLUMINESCENT MATERIALS AND OPTICAL DEVICE

BACKGROUND OF THE INVENTION

1. Field of the Invention

The present invention relates to organic electroluminescent materials for optical devices, the control of their physical properties, and optical devices including them.

2. Related Technology

With reference to FIG. 1, the architecture of an electroluminescent device according to the invention comprises a transparent glass or plastic substrate 1, an anode 2 of indium tin oxide and a cathode 4. An electroluminescent layer 3 is provided between anode 2 and cathode 4.

In a practical device, at least one of the electrodes is semi-transparent in order that light may be absorbed (in the case of a photoresponsive device) or emitted (in the case of an OLED). Where the anode is transparent, it typically comprises indium tin oxide.

Further layers may be located between anode 2 and cathode 3, such as charge transporting, charge injecting or charge blocking layers.

In particular, it is desirable to provide a conductive hole injection layer formed of a doped organic material located between the anode 2 and the electroluminescent layer 3 to assist hole injection from the anode into the layer or layers of semiconducting polymer. Examples of doped organic hole injection materials include poly(ethylene dioxythiophene) (PEDT), polyaniline as disclosed in U.S. Pat. No. 5,723,873 and U.S. Pat. No. 5,798,170, and poly(thienothiophene). Exemplary acids include PEDT doped with polystyrene sulfonate (PSS) as disclosed in EP 0901176 and EP 0947123, polyacrylic acid or a fluorinated sulfonic acid, for example Nafion®.

If present, a hole transporting layer located between anode 2 and electroluminescent layer 3 preferably has a HOMO level of less than or equal to 5.5 eV, more preferably around 4.8-5.5 eV.

If present, an electron transporting layer located between electroluminescent layer 3 and cathode 4 preferably has a LUMO level of around 3-3.5 eV.

Electroluminescent layer 3 may consist of the electroluminescent material alone or may comprise the electroluminescent material in combination with one or more further materials. In particular, the electroluminescent material may be blended with hole and/or electron transporting materials as disclosed in, for example, WO 99/48160, or may comprise a luminescent dopant in a semiconducting host matrix. Alternatively, the electroluminescent material may be covalently bound to a charge transporting material and/or host material.

Electroluminescent layer 3 may be patterned or unpatterned. A device comprising an unpatterned layer may be used an illumination source, for example. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

Suitable electroluminescent dendrimers for use in layer 3 include electroluminescent metal complexes bearing dendrimeric groups as disclosed in, for example, WO 02/066552.

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminum. Alternatively, it may comprise a plurality of metals, for example a bilayer of a low workfunction material and a high workfunction material such as calcium and aluminum as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example lithium fluoride as disclosed in WO 00/48258 or barium fluoride as disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminum. Examples of transparent cathode devices are disclosed in, for example, GB 2348316.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

The embodiment of FIG. 1 illustrates a device wherein the device is formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

Suitable electroluminescent and/or charge transporting polymers include poly(arylene vinylenes) such as poly(p-phenylene vinylenes) and polyarylenes.

Polymers preferably comprise a first repeat unit selected from arylene repeat units as disclosed in, for example, Adv. Mater. 2000 12(23) 1737-1750 and references therein. Exemplary first repeat units include: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably repeat units of formula VIII:

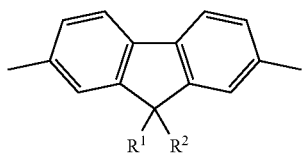

(VIII)

wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

A polymer comprising the first repeat unit may provide one or more of the functions of hole transport, electron transport and emission depending on which layer of the device it is used in and the nature of co-repeat units.

In particular:

a homopolymer of the first repeat unit, such as a homopolymer of 9,9-dialkylfluoren-2,7-diyl, may be utilized to provide electron transport.

a copolymer comprising a first repeat unit and a triarylamine repeat unit, in particular a repeat unit of formula (IX):

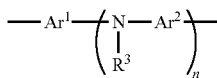

(IX)

wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 1 may be substituted. Preferred substituents include alkyl and alkoxy groups. Any of the aryl or heteroaryl groups in the repeat unit of Formula 1 may be linked by a direct bond or a divalent linking atom or group. Preferred divalent linking atoms and groups include O, S; substituted N; and substituted C.

Particularly preferred units satisfying Formula (IX) include units of Formulae 1-3:

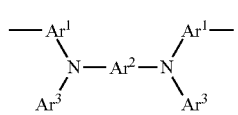

1

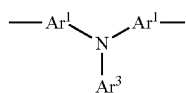

2

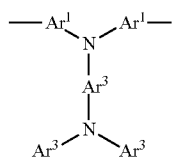

3 wherein $Ar^1$ and $Ar^2$ are as defined above; and $Ar^3$ is optionally substituted aryl or heteroaryl. Where present, preferred substituents for $Ar^3$ include alkyl and alkoxy groups.

a copolymer comprising a first repeat unit and heteroarylene repeat unit may be utilised for charge transport or emission. Preferred heteroarylene repeat units are selected from formulae 7-21:

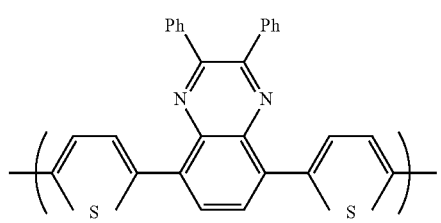

10

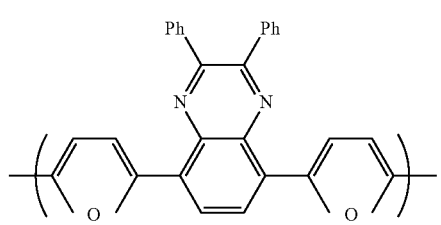

11

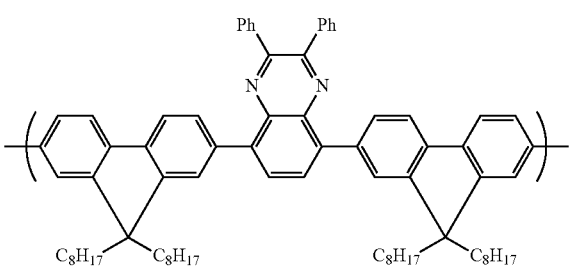

12

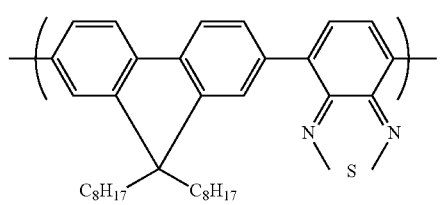

13

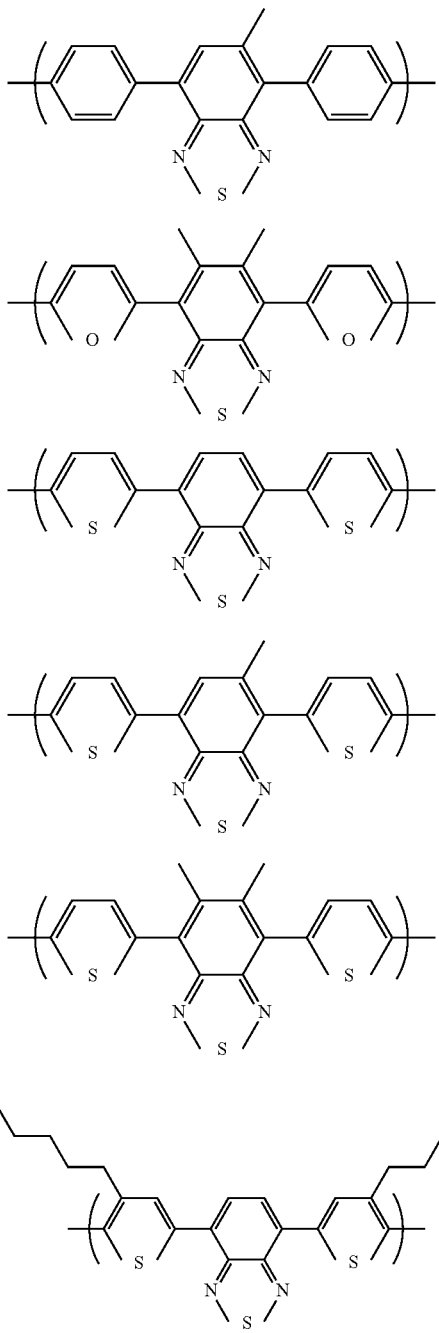

wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

Preferred methods for preparation of these polymers are Suzuki polymerization as described in, for example, WO 00/53656 and Yamamoto polymerization as described in, for example, T. Yamamoto, "Electrically Conducting And Thermally Stable—Conjugated Poly(arylene)s Prepared by Organometallic Processes", Progress in Polymer Science 1993, 17, 1153-1205. These polymerization techniques both operate via a "metal insertion" wherein the metal atom of a metal complex catalyst is inserted between an aryl group and a leaving group of a monomer. In the case of Yamamoto polymerization, a nickel complex catalyst is used; in the case of Suzuki polymerization, a palladium complex catalyst is used.

For example, in the synthesis of a linear polymer by Yamamoto polymerization, a monomer having two reactive halogen groups is used. Similarly, according to the method of Suzuki polymerization, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerization may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

A single polymer or a plurality of polymers may be deposited from solution to form layer 5. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full color displays. Inkjet printing of OLEDs is described in, for example, EP 0880303.

Other solution deposition techniques include dip-coating, roll printing and screen printing.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

By "red electroluminescent material" is meant an organic material that by electroluminescence emits radiation having a wavelength in the range of 600-750 nm, preferably 600-700 nm, more preferably 610-650 nm and most preferably having an emission peak around 650-660 nm.

By "green electroluminescent material" is meant an organic material that by electroluminescence emits radiation having a wavelength in the range of 500-580 nm, preferably 510-550 nm.

By "blue electroluminescent material" is meant an organic material that by electroluminescence emits radiation having a wavelength in the range of 400-500 nm, more preferably 430-500 nm.

Numerous hosts are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al., Appl. Phys. Lett., 79 no. 2, 2001, 156; and triarylamines such as tris-4-(N-3-methylphenyl-N-phenyl)phenylamine, known as MTDATA. Polymers are also known as hosts, in particular homopolymers such as poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinylbenzyloxyethyl,N-methylamino)-N-(2,5-di-tertbutylphenyl-napthalimide] in Adv. Mater. 1999, 11(4), 285; and poly (para-phenylenes) in J. Mater, Chem. 2003, 13, 50-55. Copolymers are also known as hosts.

Preferred metal complexes comprise optionally substituted complexes of formula (V):

wherein M is a metal; each of $L^1$, $L^2$ and $L^3$ is a coordinating group; q is an integer; r and s are each independently 0 or an integer; and the sum of $(a \cdot q)+(b \cdot r)+(c \cdot s)$ is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure color emission useful for display applications.

The d-block metals are particularly suitable for emission from triplet excited states. These metals form organometallic complexes with carbon or nitrogen donors such as porphyrin or bidentate ligands of formula (VI):

wherein $Ar^{4'}$ and $Ar^{5'}$ may be the same or different and are independently selected from optionally substituted aryl or heteroaryl; $X^1$ and $Y^1$ may be the same or different and are independently selected from carbon or nitrogen; and $Ar^{4'}$ and $Ar^{5'}$ may be fused together. Ligands wherein $X^1$ is carbon and $Y^1$ is nitrogen are particularly preferred.

Examples of bidentate ligands are illustrated below:

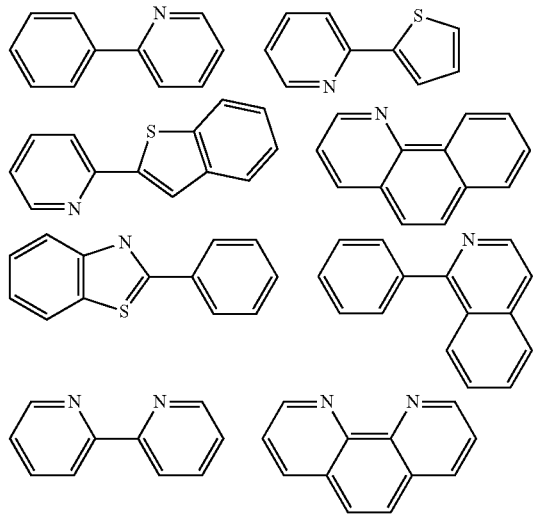

Each of $Ar^{4'}$ and $Ar^{5'}$ may carry one or more substituents. Two or more of these substituents may be linked to form a ring, for example an aromatic ring. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalize the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission color is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014]. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission color.

When producing an optical device such as a display unit, it is clearly desirable to provide a color display. This is usually achieved by providing an electroluminescent layer which comprises chemical structures that emit in the blue, green and red spectra. It is noteworthy, however, that not all users wish to use the same tones of blue, green and red. Thus, developers need to provide a range of emissive structures, each capable of emitting light at different wavelengths such that the requirements of the users can be met.

In the prior art, it is typically necessary to carefully investigate the effect of various substituent groups and their position on an emissive structure to make small changes to the emission wavelength. Such activity can be time consuming and expensive. Furthermore, as the emissive structures for blue, green and red are typically very different, it is necessary to perform such investigations three times.

SUMMARY OF THE INVENTION

It is therefore particularly desirable to create an electroluminescent material for an optical device in which the emission wavelength may be altered simply and across a wide range of wavelengths.

Phenoxazine, having the chemical structure:

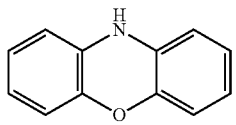 [SMILES: c1ccc2c(c1)Nc1ccccc1O2]

is a blue emitter when incorporated into a polyfluorene backbone, emitting light at a wavelength of around 450 nm. Phenoxazine on its own, that is without incorporation into a conjugated polymer, does not emit in the visible spectrum (it is believed to emit in the UV range). The inventors have discovered that by fusing aryl systems to the side rings of phenoxazine and its derivatives surprisingly results in an increase in luminescent efficiency.

Accordingly, in a first aspect the present invention relates to an electroluminescent compound comprising the structure

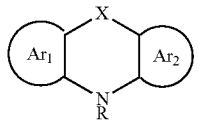

where X is selected from a group consisting of NR, O, S, SO, $SO_2$, $CR_2$, PR, POR, BR, $SiR_2$;

where R is a substituent group and $Ar^1$ and $Ar^2$ comprise aromatic rings; and wherein $Ar^1$ or $Ar^2$ is fused to a further aryl system $Ar^3$ and, where $Ar^1$ or $Ar^2$ is fused to a further aryl system $Ar^3$.

By fusing the above structure, the present inventors have found that the efficiency of the structure is improved as compared to the unfused structure. Moreover, fusing shifts the color of emission of the small molecule from the UV range into the visible blue range, thus making it useful as an electroluminescent material. As such, compounds of the present invention may be used as blue or, if sufficiently conjugated, green electroluminescent materials. Moreover, said green or blue electroluminescent materials may be used as components of a white-emitting composition such as a blend of red, green and blue electroluminescent materials or a polymer comprising red, green and blue electroluminescent regions.

In certain embodiments, the other of $Ar_1$ and $Ar^2$ is fused to a second further optionally substituted aryl system $Ar^4$.

Preferably, $Ar^1$ and/or $Ar^2$ comprise phenyl groups.

Preferably, R is selected from the group consisting of alkyl, alkoxy or aryl.

$Ar_1$, $Ar_2$ may be the same or different. In some embodiments, $Ar^3$ and $Ar^4$ comprise the same aryl system. In others they comprise different aryl systems.

Preferably, $Ar^3$ and/or $Ar^4$, if present, comprise the structure:

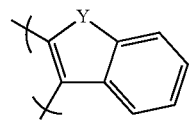

Where Y is selected from the group consisting of NR, O, S, SO, $SO_2$, $CR_2$, PR, POR, BR, $SiR_2$.

Alternatively, $Ar^3$ and/or $Ar^4$, if present, may comprise the structure:

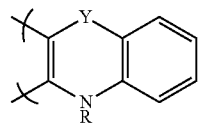

Alternatively, $Ar^3$ and/or $Ar^4$, if present, may comprise the structure

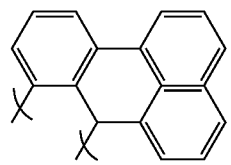

Alternatively, $Ar^3$ and/or $Ar^4$, if present, may comprise the structure

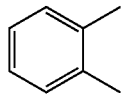

In certain embodiments, $Ar^3$ or, if present, $Ar^4$ may be fused and further conjugated to a third further aryl system $Ar^5$. Furthermore, the other of $Ar^3$ and $Ar^4$ may be fused and conjugated to a fourth further aryl system $Ar^6$.

Preferably, Ar$^5$ and/or Ar$^6$, if present, may comprise the structure:

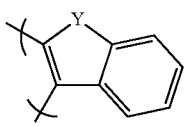

Alternatively, Ar$^5$ and/or Ar$^6$, if present, may comprise the structure:

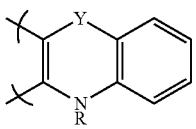

In further embodiments, Ar$^3$ may comprise the structure:

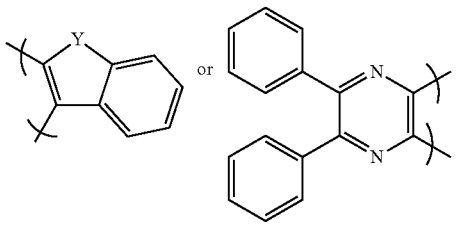

In a second aspect, the invention relates to a blue emitting electroluminescent compound as described above.

In a third aspect of the invention, there is provided a monomer comprising an electroluminescent compound as described above, wherein at least one of the aryl systems is substituted with one or more reactive groups Z.

Preferably, the one or all of the reactive groups comprise a halide, boronic ester or a boronic acid group.

In a fourth aspect, the invention relates to an electroluminescent polymer comprising a copolymer of a monomer as described above and a second monomer having a structure:

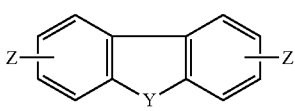

Preferably, the electroluminescent polymer comprises up to 20 mol % of a monomer as described above, more preferably less than or equal to to 10 mol % and most preferably less than or equal to 5 mol %.

In a further aspect, the invention relates to a blue emitting electroluminescent polymer as described above.

In a yet further aspect of the invention, there is provided an optical device comprising a first electrode for injection of positive charge carriers, a second electrode for injection of negative charge carriers and a layer located between the first and second electrode comprising an electroluminescent compound as described herein.

In a further aspect of the invention, there is provided a method of tuning the emission wavelength of an electroluminescent compound comprising the structure:

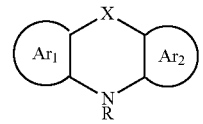

where X is selected from a group consisting of NR, O, S, SO, SO$_2$, CR$_2$, PR, POR, BR, SiR$_2$, and wherein the method comprises fusing one or more further aryl systems to one or both of Ar$^1$ and Ar$^2$.

In a further aspect, the invention relates to an electroluminescent material comprising the structure:

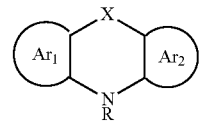

wherein the emission wavelength of the material has been tuned by the fusing of one or more aryl systems to one or both of Ar$^1$ and Ar$^2$.

BRIEF DESCRIPTION OF THE DRAWINGS

In order that the invention may be better understood, it is described below with reference to the accompanying drawings.

FIG. 1 shows a schematic diagram of an optical device.

EXAMPLE 1

Detailed Description

A photoemissive compound, Compound 1 was synthesized in the laboratory using the method described below.

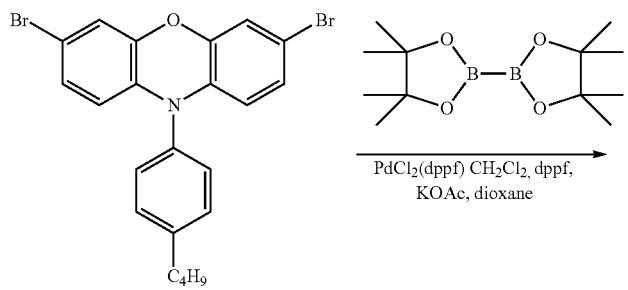

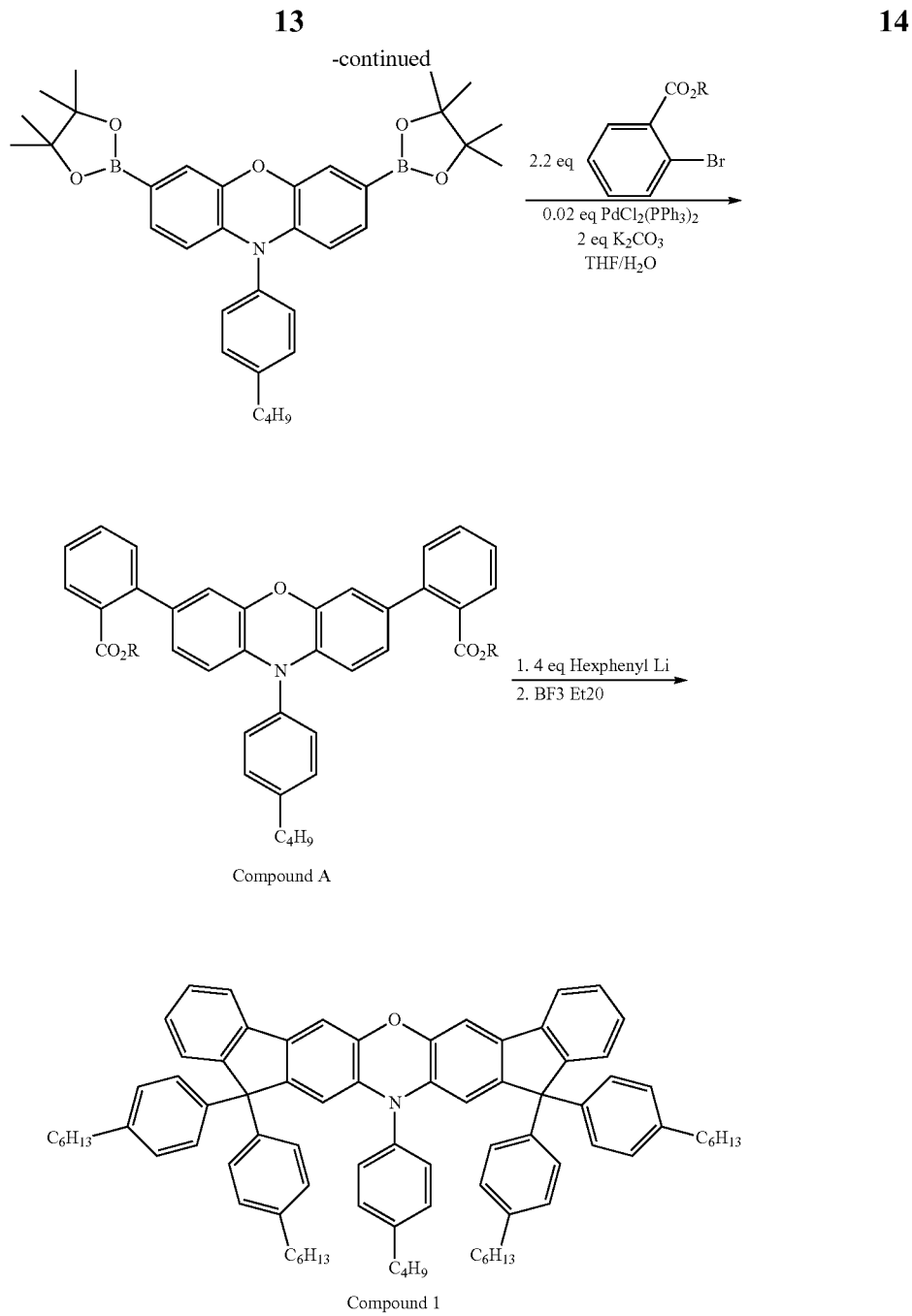

Compound A

Compound 1

The boronate ester was synthesized via Pd-catalysed Suzuki coupling of the starting compound with bis(pinacolato)diboron (T. Ishiyama, M. Murata, N. Miyaura, J. Org. Chem. 1995, 60, 7508-7510; A. Giroux, Tetrahedron Lett. 2003, 44, 233-235). Pd catalyzed coupling of the boronate ester with methyl 2-bromobenzoate gave the dicarboxylic acid (F. Schindler, J. Jacob, A. C. Grimsdale, U. Scherf, K. Müllen, J. M. Lupton, J. Feldmann, Angew. Chem. Int. Ed. 2005, 44, 1520-1525). A solution of the dicarboxylic acid was slowly added to a solution of 4-hexylphenyl lithium (lithiation of 4-hexylphenylbromide and n-butyl lithium in anhydrous THF) at −75° C. After warming to RT and standard work-up, the alcohol was isolated as oil and purified by column chromatography (toluene/hexane 1:1). Reaction with 30 eq borontrifluoride etherate in anhydrous dichloromethane, followed by standard work-up and column chromatography (toluene/hexane 1:1) gave Compound 1 as pale yellow oil. The structure was confirmed by NMR and LCMS.

The identity and purity of Compound 1 were confirmed by one dimensional proton nuclear magnetic resonance (NMR) and Correlation Spectroscopy (COSY) and Liquid Chromatography/Mass Spectrometry (LCMS).

EXAMPLE 2

A second reaction scheme was used to produce a photo emissive monomer, Monomer 1, for inclusion in a polymer backbone.

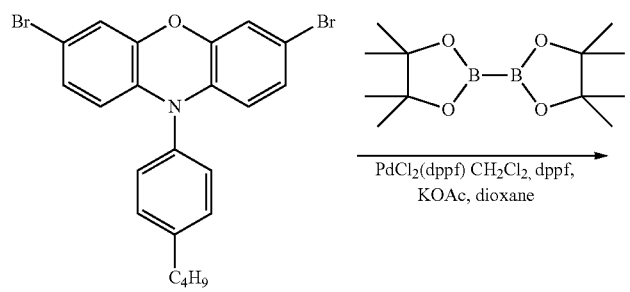
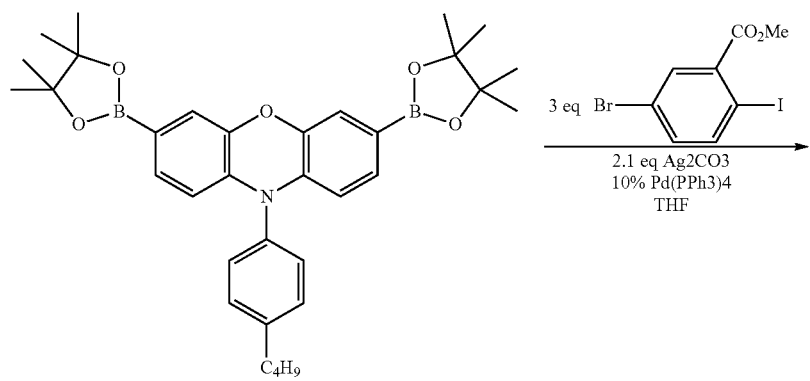
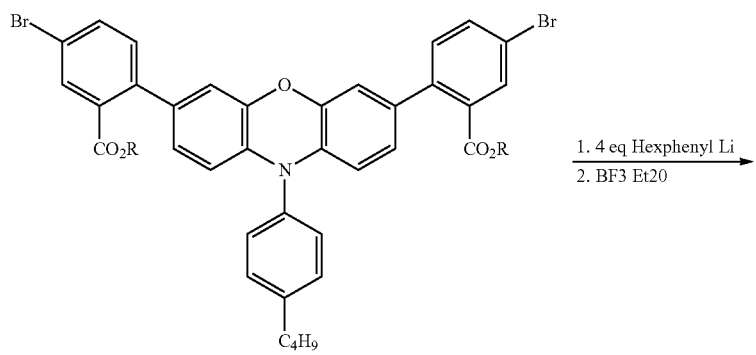
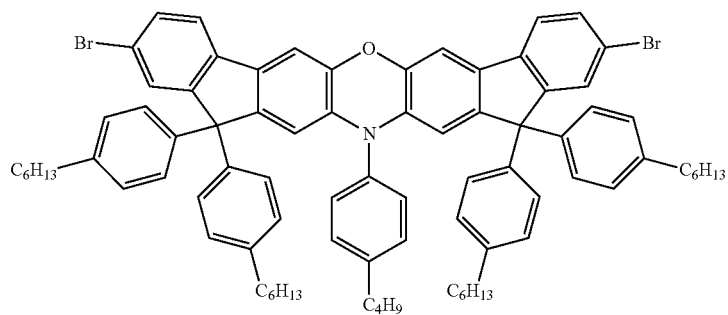
Monomer 1

The first step is as per the synthesis in Example 1. The dibromo-dicarboxylic acid was prepared as described in D. J. Sinclair, M. S. Sherburn, J. Org. Chem. 2005, 70, 3730-3733. Reaction of this compound with 4-hexylphenyllithium, followed by ring closure yielded Monomer 1 as pale yellow solid. The structure was confirmed by NMR and LCMS.

The monomer was co-polymerised with a fluorene monomer of Formula (VIII) and an amine monomer of formula (IX), via a Suzuki polymerisation, to make a blue emitting electroluminescent polymer.

EXAMPLE 3

Polymer

Polymers comprising repeat units based on Monomer 1 and fluorene repeat units of formula VIII was prepared by Suzuki polymerisation as described in WO 00/53656.
Composition Polymer 1
3.5% Monomer 1, 16.5% Monomer 3, 30% Monomer 4, 50% Monomer 5
Molecular weight relative to polystyrene standard: Mw 859 k, Mp 779 k, Mn 311 k, Pd 2.78

COMPARATIVE EXAMPLE

For the purpose of comparison, a polymer was prepared as per Example 3, except that the polymer was synthesised using the unfused phenoxazine monomer below in place of Monomer 1:
Composition Polymer 2 (Comparative Example)
3.5% Monomer 2, 16.5% Monomer 3, 30% Monomer 4, 50% Monomer 5
Molecular weight relative to polystyrene standard: Mw 394 k, Mp 343 k, Mn 148 k, Pd 2.59

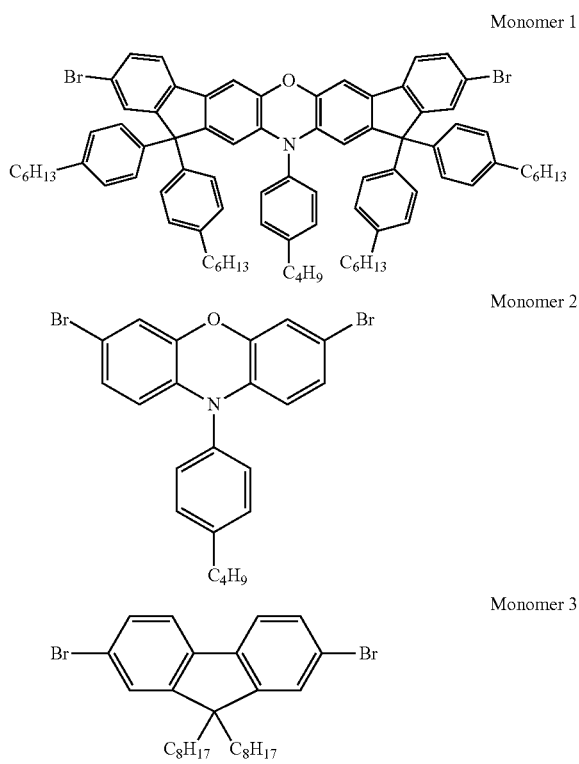

Monomer 1

Monomer 2

Monomer 3

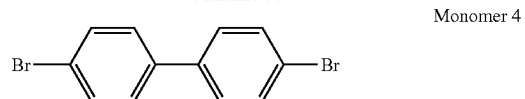

Monomer 4

Monomer 5

Device Example

Poly(ethylene dioxythiophene)/poly(styrene sulfonate) (PEDT/PSS), available from H C Starck of Leverkusen, Germany as Baytron P® was deposited over an indium tin oxide anode supported on a glass substrate by spin coating. A hole transporting layer comprising fluorene repeat units of formula VIII and amine repeat units of formula IX was deposited over the PEDT/PSS layer by spin coating from xylene solution and heated at 180° C. for 1 hour. Polymer 1 was deposited over the hole transporting layer by spin-coating from xylene solution to a thickness of around 70 nm. A BaO/Al cathode was formed over polymer 1 by evaporating a first layer of barium oxide to a thickness of up to about 5 nm and a second layer of aluminium barium to a thickness of about 100 nm. Finally, the device is sealed using a metal enclosure containing a getter that is placed over the device and glued onto the substrate in order to form an airtight seal.

Polymer 1 was found to have a peak external quantum efficiency of 6.28%. In contrast, a corresponding device comprising the polymer of the Comparative Example (Polymer 2) in place of Polymer 1 was found to have a peak external quantum efficiency of only 5.23% (that is, about 20% lower than Polymer 1.

By following the same reaction scheme as in the Examples, while making the appropriate changes to the reagents, it is possible to produce the compounds 2 to 13 shown below, including their equivalent monomers for inclusion in polymer backbones. Each of these compounds emitted at a characteristic wavelength, dependent upon their substituent groups and the extent of their conjugation.

Each of the compounds 1 to 13 can be used to form a layer of "small molecule" (i.e. non-polymeric) material as an emitter/hole transport layer in a small molecule OLED device. The layer can consist of such a material, or comprise the material together with other suitable compounds. Compounds 1 to 13 for use in such a small molecule OLED device can each be optionally substituted, for example with groups which will help improve solubility for deposition from solution, for example by ink-jet printing or spin coating.

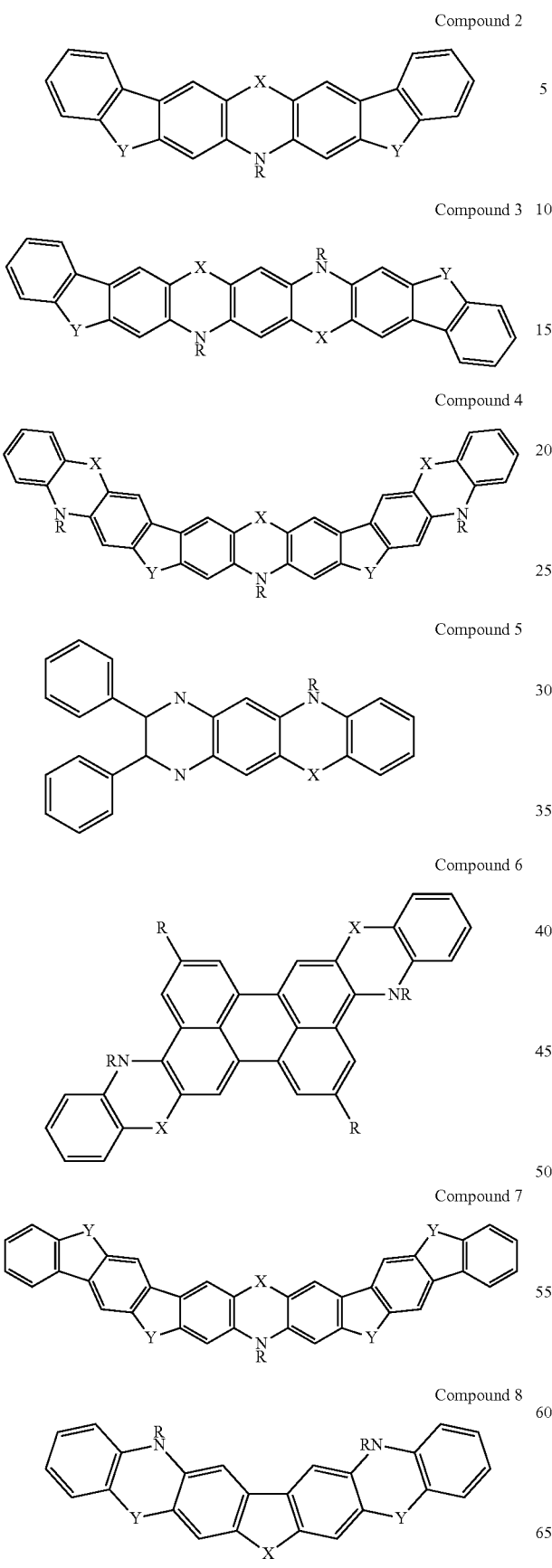

Compound 2

Compound 3

Compound 4

Compound 5

Compound 6

Compound 7

Compound 8

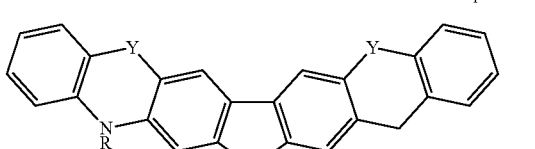

Compound 9

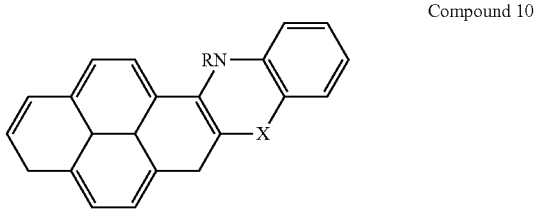

Compound 10

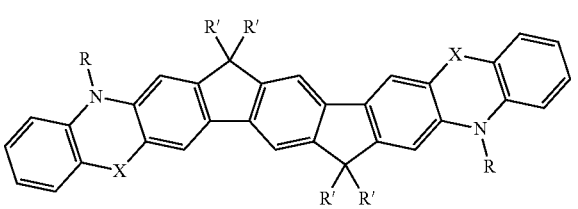

Compound 11

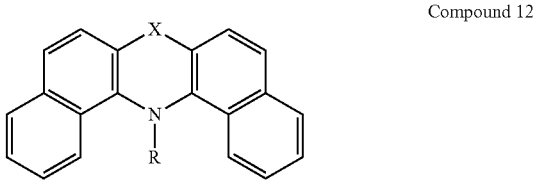

Compound 12

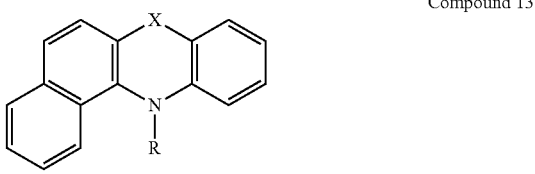

Compound 13

Detailed information on device structures and methods of making both polymer and small molecule OLED devices are described in the book "Organic Light-Emitting Materials and Devices" Edited by Zhigang Li and Hong Meng, published by CRC Press (Taylor and Francis) in 2007 (ISBN 1-57444-574-X), especially Chapters 2 and 8 for polymer materials and devices, and Chapters 3 and 7 for small molecule materials and devices.

The invention claimed is:

1. An electroluminescent polymer comprising the following repeat unit:

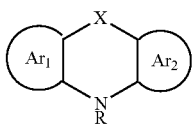

where X is selected from the group consisting of NR, O, S, SO, $SO_2$, $CR_2$, PR, POR, BR, and $SiR_2$;
where R is a substituent group and $Ar^1$ and $Ar^2$ comprise aromatic rings;

wherein Ar¹ or Ar² is fused to a further aryl system Ar³; and,
wherein Ar³ comprises the structure

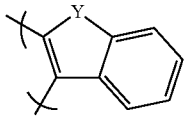

where Y is selected from the group consisting of NR, O, S, SO, SO₂, CR₂, PR, POR, BR, and SiR₂.

2. An electroluminescent polymer according to claim 1 wherein the other of Ar¹ and Ar² is fused to a second, optionally substituted aryl system Ar⁴.

3. An electroluminescent polymer according to claim 1, wherein at least one of Ar¹ and Ar² comprises a phenyl group.

4. An electroluminescent polymer according to claim 1, wherein R is selected from the group consisting of hydrogen, alkyl, alkoxy, and aryl.

5. An electroluminescent polymer according to claim 2, wherein Ar³ and Ar⁴ comprise the same aryl system.

6. An electroluminescent polymer according to claim 1, wherein the repeat unit is free from symmetry.

7. An electroluminescent polymer according to claim 2 wherein at least one of Ar³ and Ar⁴ is fused and further conjugated to a third optionally substituted aryl system Ar⁵.

8. An electroluminescent polymer according to claim 7 wherein the other of Ar³ and Ar⁴ is fused and conjugated to a fourth, optionally substituted aryl system Ar⁶.

9. An electroluminescent polymer according to claim 7 wherein Ar⁵ comprises the structure

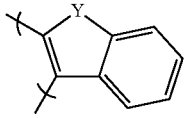

10. An electroluminescent polymer according to claim 7 wherein Ar⁵ comprises the structure

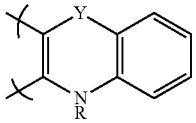

11. A polymer as claimed in claim 1 in which the polymer is a conjugated polymer.

12. A monomer for preparing a polymer as claimed claim 1 comprising a compound having the structure:

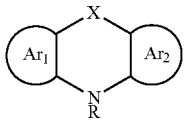

where X is selected from the group consisting of NR, O, S, SO, SO₂, CR₂, PR, POR, BR, and SiR₂;
where R is a substituent group and Ar¹ and Ar² comprise aromatic rings; and, wherein Ar¹ or Ar² is fused to a further aryl system Ar³, wherein the aryl system Ar³ is substituted with one or more reactive groups Z, and wherein Ar³ comprises the structure

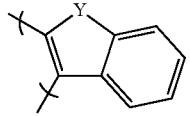

where Y is selected from the group consisting of NR, O, S, SO, SO₂, CR₂, PR, POR, BR, and SiR₂.

13. A monomer according to claim 12, wherein one or all of the reactive groups comprise a halide, a boronic ester, or a boronic acid group.

14. An electroluminescent polymer comprising a copolymer of a monomer according to claim 12 and a second monomer having a structure

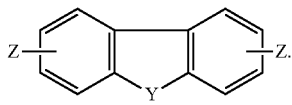

15. An electroluminescent polymer according to claim 14, comprising less than 20 mol % of said second monomer.

16. An optical device comprising a first electrode for injection of positive charge carriers, a second electrode for injection of negative charge carriers and a layer located between the first and second electrode comprising an electroluminescent polymer according to claim 1.

17. An electroluminescent material for use in a light emitting device, the material comprising one of the following optionally substituted structures 1-4 and 7:

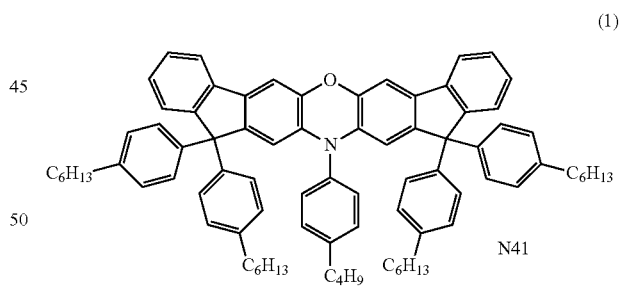
(1)

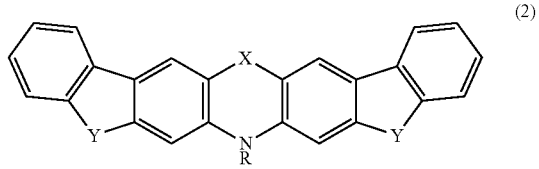
(2)

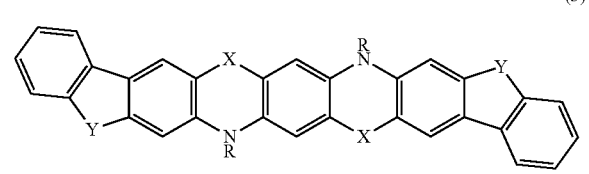
(3)

-continued (4)

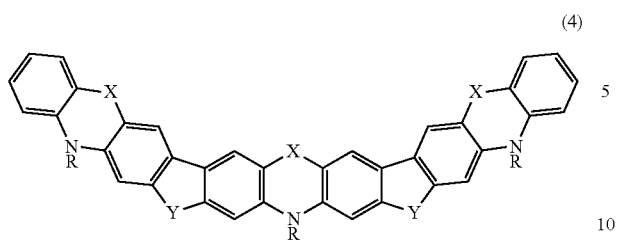

(7)

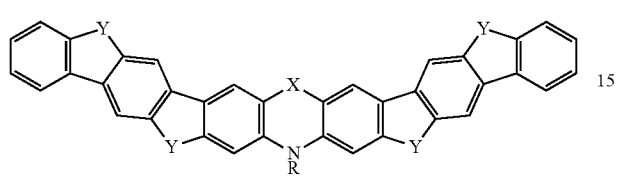

where X and Y are selected from the group consisting of NR, O, S, SO, SO$_2$, CR$_2$, PR, POR, BR, and SiR$_2$, and where R is selected from the group consisting of hydrogen, alkyl, alkoxy, and aryl.

18. An electroluminescent polymer according to claim 2 wherein Ar$^4$ comprises the structure

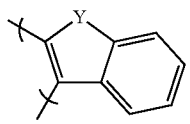

where Y is selected from the group consisting of NR, O, S, SO, SO$_2$, CR$_2$, PR, POR, BR, and SiR$_2$.

19. An electroluminescent polymer according to claim 2, wherein Ar$^4$ comprises the structure

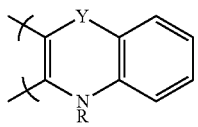

where Y is selected from the group consisting of NR, O, S, SO, SO$_2$, CR$_2$, PR, POR, BR, and SiR$_2$.

20. An electroluminescent polymer according to claim 2 wherein Ar$^4$ comprises the structure

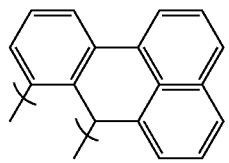

21. An electroluminescent polymer according to claim 2 wherein Ar$^4$ comprises the structure 22. An electroluminescent polymer according claim 8 wherein at least one of Ar$^5$ and Ar$^6$ comprises the structure

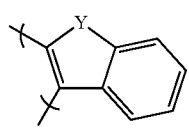

23. An electroluminescent polymer according to claim 8 wherein at least one of Ar$^5$ and Ar$^6$ comprises the structure

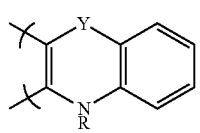

24. An electroluminescent polymer according to claim 1, wherein the repeat unit has the following structure:

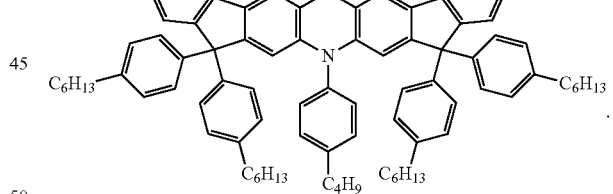

* * * * *